(12) United States Patent
Suzuki

(10) Patent No.: US 6,353,648 B1
(45) Date of Patent: Mar. 5, 2002

(54) INTEGRATED CIRCUIT

(75) Inventor: Kazumasa Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/185,612

(22) Filed: Nov. 4, 1998

(30) Foreign Application Priority Data

Nov. 5, 1997 (JP) .............................. 9-302291

(51) Int. Cl.⁷ ................................................ H03D 3/24
(52) U.S. Cl. ...................................... 375/376; 327/161
(58) Field of Search ................................ 375/376, 375; 327/153, 161, 158, 149; 713/401

(56) References Cited

U.S. PATENT DOCUMENTS

| 5,459,756 A | * 10/1995 | Stilwell et al. .............. 375/376 |
| 5,481,573 A | * 1/1996 | Jacobowitz et al. ......... 375/356 |
| 5,675,620 A | * 10/1997 | Chen .......................... 375/376 |

FOREIGN PATENT DOCUMENTS

| JP | 59-172898 | 9/1984 |
| JP | 61-144124 | 7/1986 |
| JP | 1-198113 | 8/1989 |
| JP | 2-132682 | 5/1990 |
| JP | 2-148914 | 6/1990 |
| JP | 3-64208 | 3/1991 |
| JP | 3-83415 | 4/1991 |
| JP | 4-140812 | 5/1992 |
| JP | 8-97715 | 4/1996 |

* cited by examiner

*Primary Examiner*—Chi Pham
*Assistant Examiner*—Phuong Phu
(74) *Attorney, Agent, or Firm*—Foley & Lardner

(57) ABSTRACT

Even when the timing signal used in the internal circuit is formed from the clock signal by the delay device, a margin to the timing signal is deleted or reduced so that operating frequency is designed as high as possible. A delay device is composed of inverters which are connected in series and time constant circuits connected in parallel with the outputs of the inverters. The time constant circuits include series circuits each having an MOS transistor and a capacitor. The change of the on-state resistance of the MOS transistor is controlled by the voltage control signal of a voltage controlled oscillator. The delay time of the internal delay device is externally controlled so that the delay time of the delay device for generating the timing signal of an internal circuit is changed. The internal circuit can be operated in a normal manner even if the operating frequency is changed to lower than usual.

13 Claims, 10 Drawing Sheets

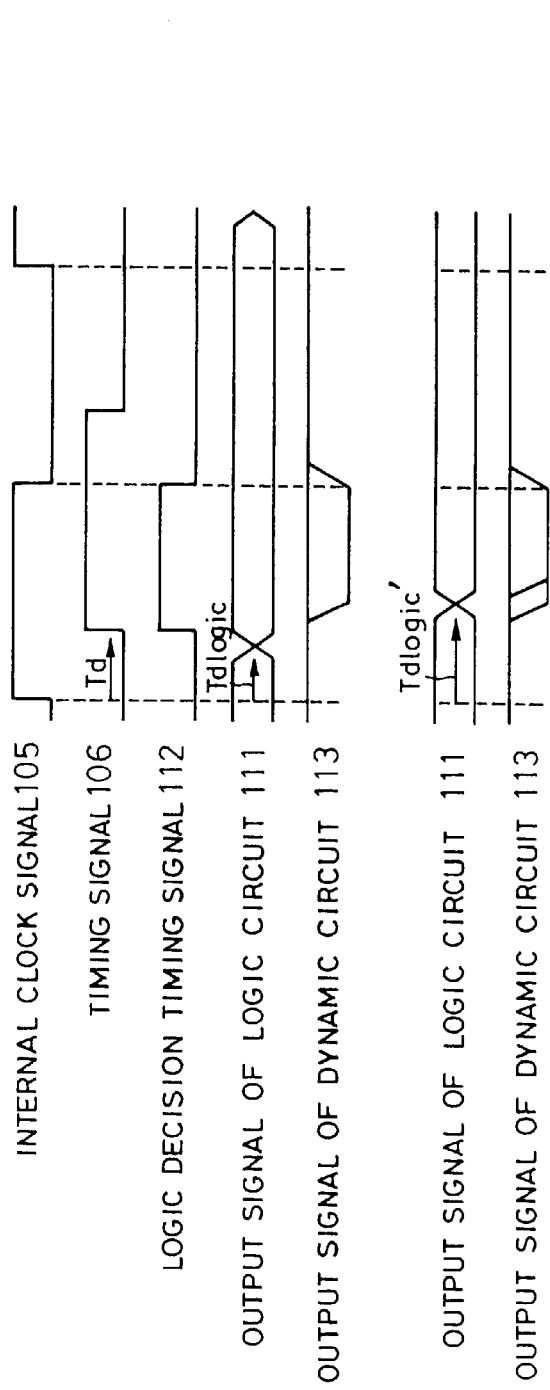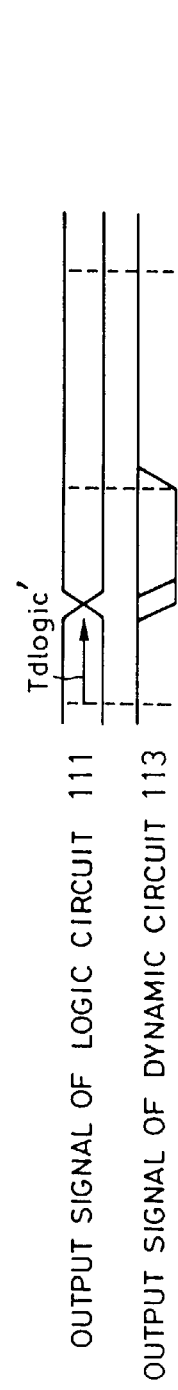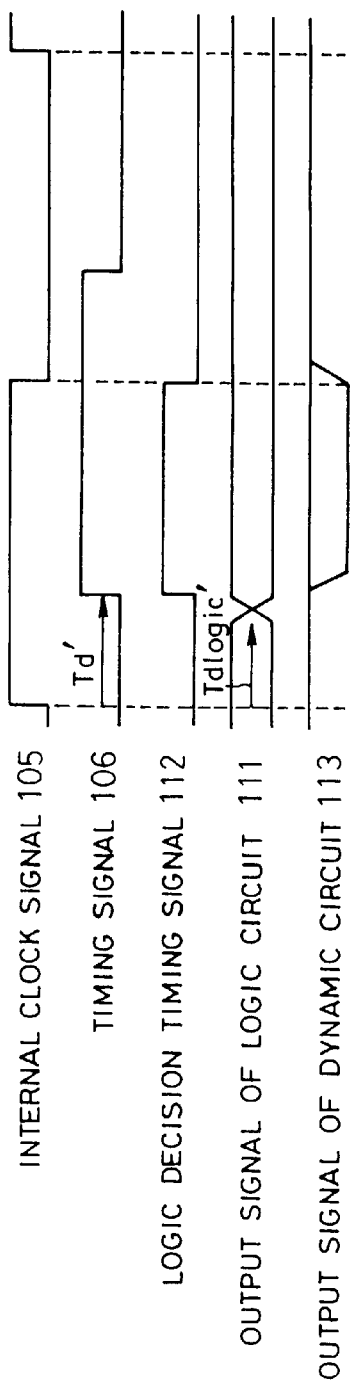

INTEGRATED CIRCUIT

BACKGROUND OF THE INVENTION

1. Field of the Invention

The present invention relates to an integrated circuit, and more particularly to an integrated circuit in which an internal circuit is operated by a timing signal obtained by delaying a clock signal by a prescribed time as well as the clock signal.

2. Description of the Related Art

Generally, a dynamic circuit has been employed at times in a circuit part which is operated at high speed like a memory circuit, in the integrated circuit. The dynamic circuit serves to precharge an output with electricity during a certain period of a clock (For instance, when the clock has a voltage of low level) and output a logic during a remaining period of a clock (For instance, when the clock has a voltage of high level). However, when an input signal comes later than a logic decision period, the operation of the dynamic circuit may be possibly uncertain.

Thus, in order to overcome this problem, an attempt has been made that the logic decision period is shortened by a timing signal formed by delaying a clock signal and the input signal is determined before the logic decision period. FIG. 7 shows a diagram for explaining the constitution of a conventional circuit. Referring to FIG. 7, an integrated circuit 1 comprises a phase locked loop (PLL) circuit 2 for receiving an external clock signal 100 and an internal circuit 6. The internal circuit 6 is actuated by employing a signal 105 outputted from the PLL circuit 2 as a clock signal. A part of the circuit 6 is actuated by using a timing signal 106a formed by delaying the clock signal 105 by a delay device 7a. An external reset signal 101, an external input signal 102, an external output signal 103 and an external input and output signal 104 are inputted and/or outputted to the internal circuit 6 to carry out a desired processing.

FIG. 8 is a circuit diagram showing the internal construction of the delay device 7a. The delay device 7a comprises inverter circuits 10 which are connected in series in a plurality of stages. If the inverter has a delay of Tdinv per stage, the total of delay time of 2n×Tdinv may be obtained for the 2n stages.

FIG. 9 illustrates an example of a dynamic circuit which utilizes a delay signal. In this case, the dynamic circuit is constituted of a PMOS transistor 16 for precharging an output signal 113 with electricity, an NMOS transistor 17 for deciding a logic and an NMOS transistor 18 for determining the logic decision period. The output signal 111 of a logic circuit 19 is inputted to the NMOS transistor 17. The logical product signal of the internal clock signal 105 and a timing signal 106b delayed by a delay device 7b is formed by an AND circuit 20 to generate a logic decision period timing signal 112. The delay of the delay device 7b at this time is set to a value not smaller than that of the logic circuit 19.

FIG. 10 is a timing chart showing the operation of the dynamic circuit illustrated in FIG. 9. The signals the same as those of FIG. 9 are represented by the same symbols in FIG. 9.

FIG. 10A is a diagram showing timing under a standard condition upon design of a timing signal from a clock signal. As apparent from FIG. 10A, the clock signal 105 is delayed by the delay device 7b so that the timing signal 106b is formed. It is assumed that this delay time is Td. The logic decision timing signal 112 can be obtained from the logical AND of the internal clock signal 105 and the timing signal 106b.

The output signal 111 of the logic circuit 19 which serves as the input signal of the dynamic circuit reaches the internal clock signal 105 with the delay of time Td logic. The dynamic circuit receives this signal and outputs a processing result when the logic decision timing signal 112 has high voltage. However, the output delay time of the logic circuit 19 increases because of unevenness or the like in a transistor performance, an incidental resistance component or an incidental capacity component at the time of forming the integrated circuit, so that it may become time Td logic' which is larger than the time Td. Timing in this instance is illustrated in FIG. 10B.

The output signal of the dynamic circuit 113 forms temporarily a logic with the logic output signal 111 which is not changed, and then the output signal 113 is changed again by the logic output signal 111 which has been changed. The output signal of the dynamic circuit 113 only changes from the voltage of high level to the voltage of low level. Therefore, if the output signal of the dynamic circuit 113 is located at the voltage of low level when it should be located at the voltage of high level, the output is disadvantageously kept located at the voltage of low level, which inconveniently causes the dynamic circuit to be operated in a wrong way.

As shown in FIG. 10C, even if the cycle of the internal clock signal 105 is lengthened, the dynamic circuit cannot be returned to a normal operation because the delay time Td is not changed. In order to avoid such phenomenon, it is necessary to provide a margin between the time Td and the time Td logic and design the dynamic circuit so as to be operated normally even when there is unevenness in the margin. If the cycle of the internal clock signal 105 is short, the time corresponding to this margin between the time Td and the time Td logic becomes so large as not to be neglected relative to the cycle of the clock. Consequently, the performance of the dynamic circuit is undesirably deteriorated. Thus, the margin between the time Td and the time Td logic needs to be deleted as much as possible.

A voltage controlled oscillator 5 forming the PLL 2 constitutes a loop by connecting inverters in series in a plurality of stages. The voltage controlled oscillator 5 is equipped with a mechanism for controlling the delay time by these inverters so that it serves to control oscillating frequency. An output signal is outputted from a terminal at an intermediate part of the connection of the inverters so that a timing signal can be formed. However, this timing signal thus formed needs to be distributed to the internal circuit 6 similarly to the internal clock signal 105. In this case, the time of the internal clock signal 105 which arrives at the internal circuit 6 needs to coincide with the time of the timing signal which arrives at the internal circuit 6. It has been disadvantageously difficult to realize the coincidence of the arrival time of these signals.

SUMMARY OF THE INVENTION

The present invention has been devised in order to overcome the above-mentioned shortcomings of the prior art and it is an object of the present invention to provide an integrated circuit capable of designing operating frequency as high as possible by deleting a margin in delay time even when a timing signal is formed from a clock signal by a delay device.

In order to achieve this object, an integrated circuit according to the present invention comprises: a phase locked loop circuit which feeds back the oscillating output signal of a voltage controlled oscillator and controls the oscillating frequency of the oscillator based on the result of comparison of the phase between an oscillating output signal and an externally supplied clock signal, and a delay device which delays the oscillating output signal by a prescribed time, the integrated circuit being operated by using the signal thus delayed, and the delay device controlling the change of the delay time depending on a control signal corresponding to the above-mentioned phase comparison result.

As described, according to the integrated circuit of the present invention, a margin is not given to the timing signal and a delay time generated by the internal delay device is designed to be externally controlled. Accordingly, since the delay of the delay device for forming the timing signal of the internal circuit is also changed, the internal circuit can be operated in a normal manner even if the operating frequency is changed to lower than usual. Therefore, even when a margin is deleted upon design of the operating frequency, the internal circuit can be operated in a normal way by adjusting the clock frequency.

BRIEF DESCRIPTION OF THE DRAWINGS

Other characteristics will appear on reading the description which follows given in reference to the attached drawings in which:

FIG. 3 is a timing chart showing the operation of an integrated circuit illustrated in FIG. 1, FIG. 3A shows the operation of the integrated circuit upon design of the circuit, FIG. 3B shows the operation of the integrated circuit upon production of the circuit and FIG. 3C shows the operation of the integrated circuit when a clock cycle is lengthened;

FIG. 10 is a timing chart showing the operation of the integrated circuit illustrated in FIG. 7.

DESCRIPTION OF THE PREFERRED EMBODIMENTS

The embodiments of the present invention will be described hereinafter with reference to the accompanying drawings.

Figure 1:
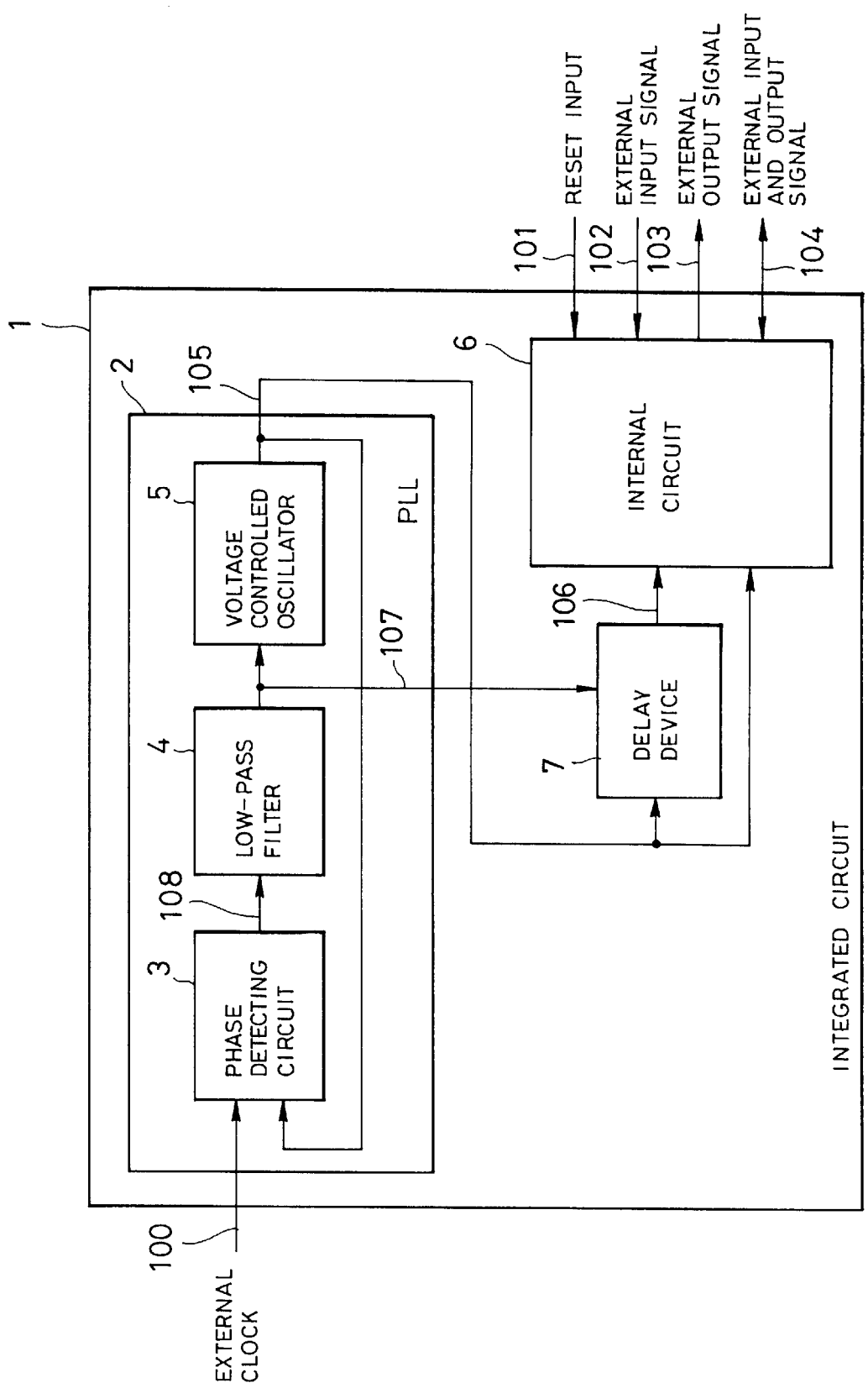
FIG. 1 is a block diagram showing the constitution of an integrated circuit according to a first embodiment of the present invention.
Figure 7:
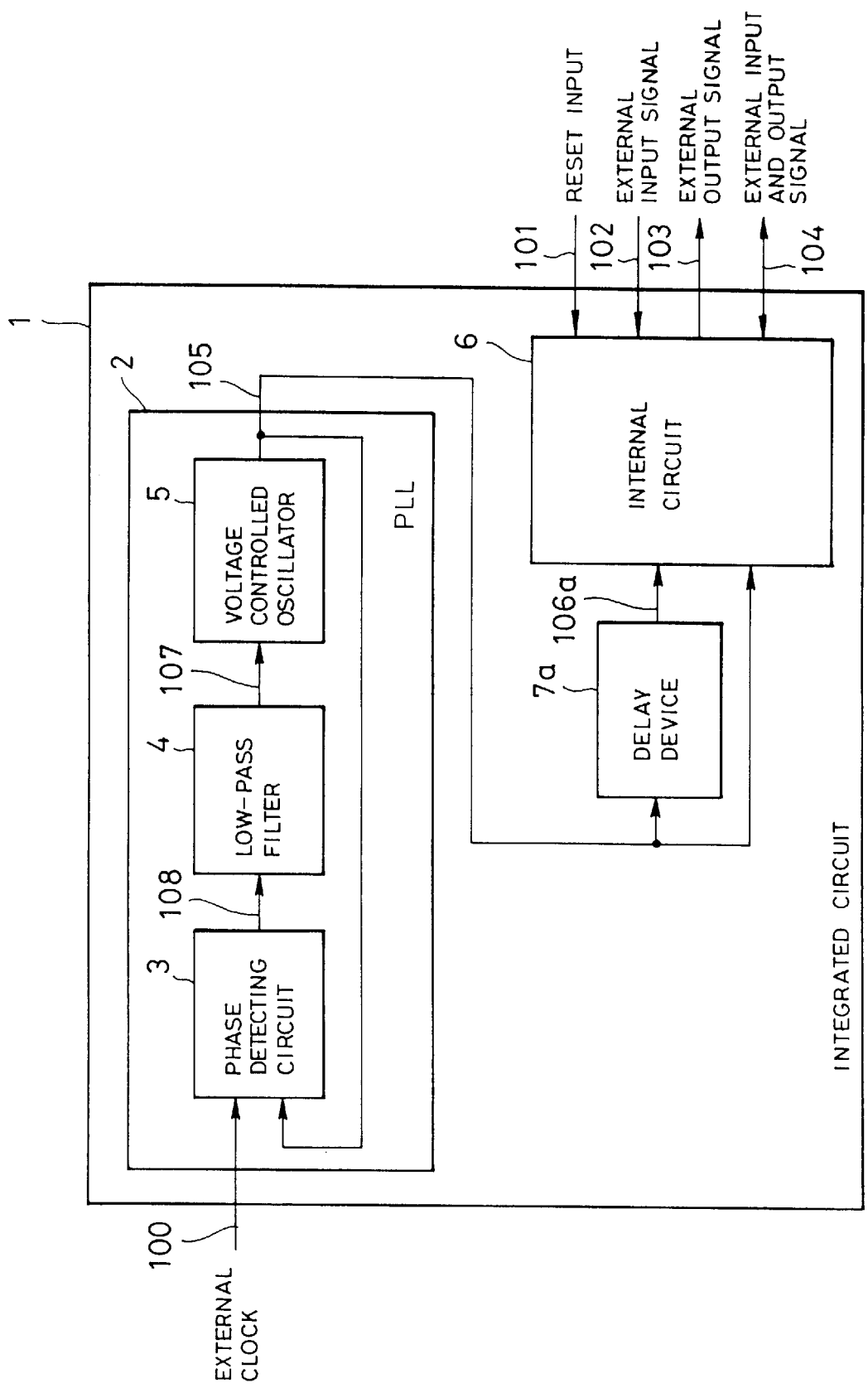
FIG. 7 is a block diagram showing the constitution of a conventional integrated circuit.
Figure 8:
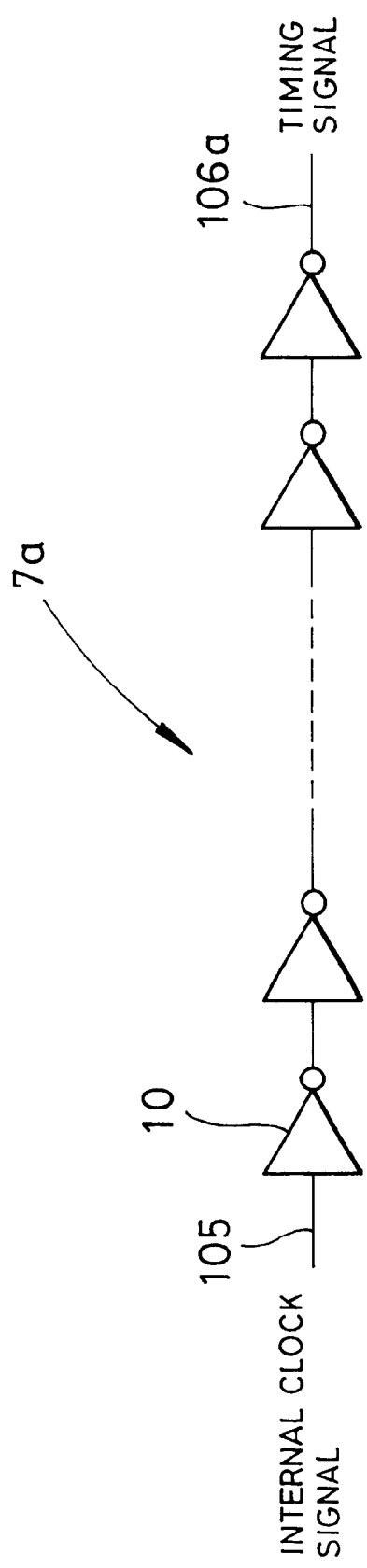
FIG. 8 is a circuit diagram showing the internal structural example of a delay device illustrated in FIG. 7.

FIG. 1 is a block diagram showing the constitution of an integrated circuit according to a first embodiment of the present invention. In FIG. 1, parts equal to those shown in FIG. 7 are represented by the reference numerals the same as those of FIG. 7. Therefore, the detailed explanation of these parts will be omitted. Referring to FIG. 1, an external clock signal 100 which is externally inputted is used in an integrated circuit 1 so that a PLL 2, that is to say, a phase locked loop circuit 2 generates an internal clock signal 105 for operating an internal circuit 6.

The PLL 2 comprises a phase detector 3, a low-pass filter 4 and a voltage controlled oscillator 5. The output of the phase detector 3 is inputted to the low-pass filter 4 and the output of the low-pass filter 4 is inputted to the voltage controlled oscillator 5. The output of the voltage controlled oscillator 5 is employed as the internal clock signal 105. On the other hand, the output of the voltage controlled oscillator 5 is inputted to the phase detector 3. The external clock signal 100 is also inputted to the phase detector 3. The phase difference between the internal clock signal 105 and the external clock signal 100 appears as a pulse in an output. A timing signal 106 used for a part of the internal circuit 6 is formed by delaying the internal clock signal 105 by a delay device 7. The amount of the delay of the delay device 7 is controlled by using a voltage control signal 107 which is employed for controlling the frequency of the voltage controlled oscillator 5.

Figure 2:
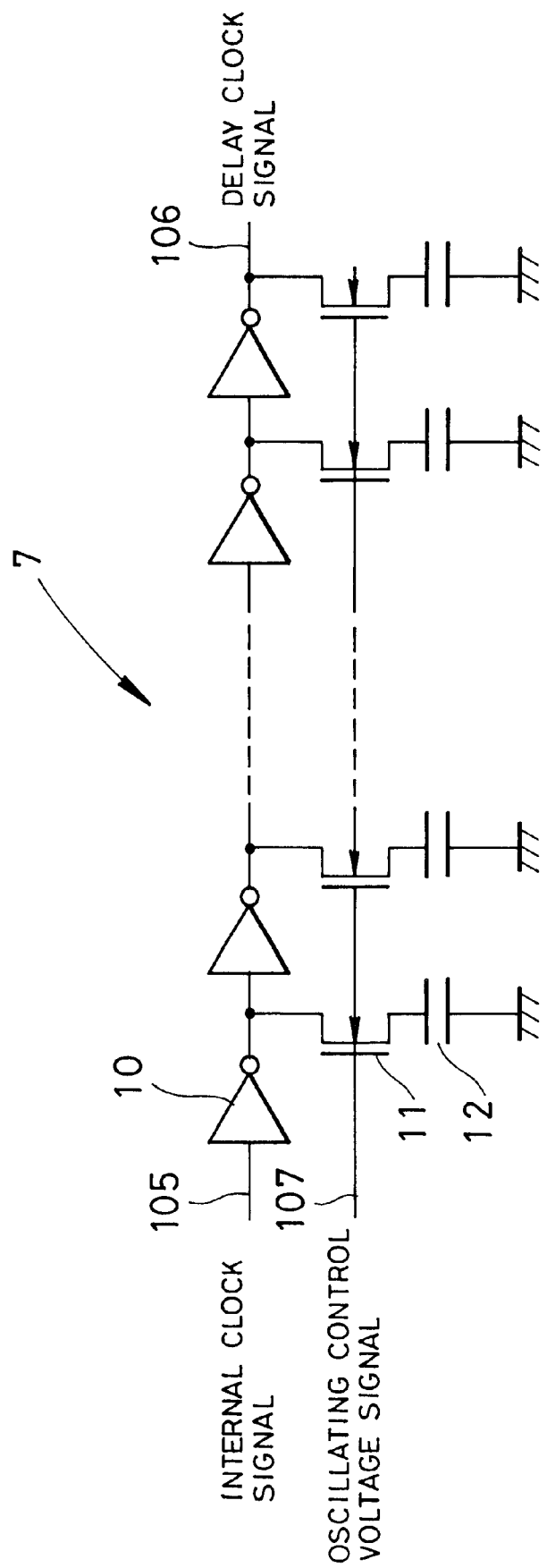
FIG. 2 is a circuit diagram showing the internal structural example of a delay device illustrated in FIG. 1.

FIG. 2 is a diagram showing the structural example of the delay device 7 illustrated in FIG. 1. Referring to FIG. 2, the delay device 7 is composed of inverters 10 which are connected in series in a plurality of stages. A series circuit including an NMOS transistor 11 and a capacitor 12 is connected to the output of each of the inverters as a load for adjusting the delay.

In other words, the delay device 7 comprises the inverters 10 and time constant circuits each including the NMOS transistor 11 and the capacitor 12 which are respectively connected in parallel with the outputs of the inverters 10. Then, the resistances, that is to say, the on-state resistances of the channels of the NMOS transistors 11 are controlled by the voltage control signal 107, so that the delay time of the inverters 10 is respectively controlled and the total delay time is adjusted. In this connection, if an inverter chain loop which constitutes the voltage controlled oscillator 5 of the PLL 2 has a construction similar to that of the delay device 7 so as to adjust the delay time of the inverters, the delay time can be controlled substantially in proportion to clock frequency.

FIG. 3 is a timing chart showing the operation of the integrated circuit illustrated in FIG. 1.

Figure 9:
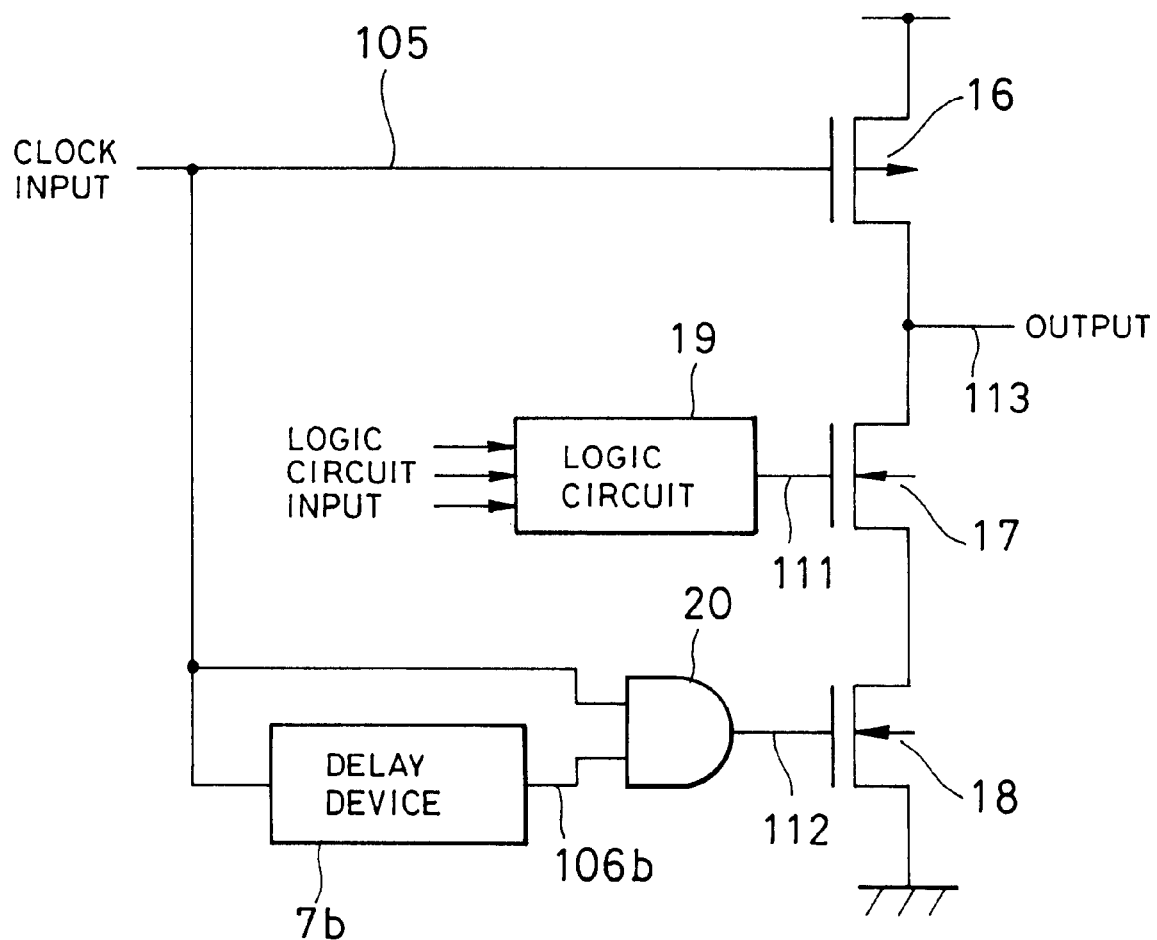
FIG. 9 is a circuit diagram showing the constructional example of a dynamic circuit.
Figure 10A:
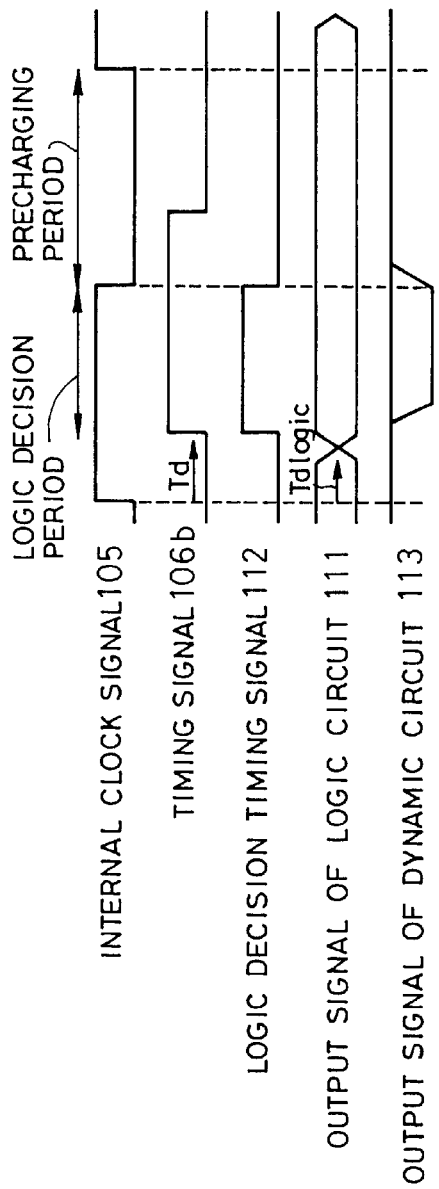
FIG. 10A shows the operation of the integrated circuit upon design of the circuit.
Figure 10B:
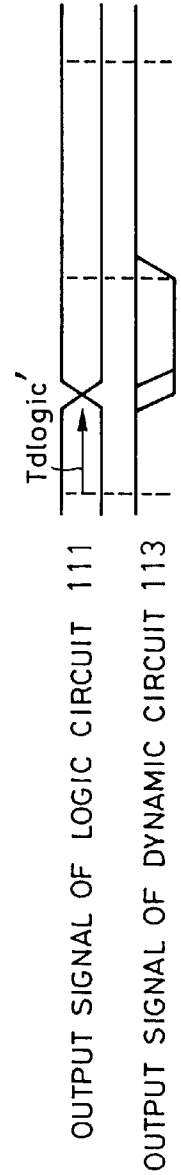
FIG. 10B shows the operation of the integrated circuit upon production of the circuit and FIG. 10C shows the operation of the integrated circuit when a clock cycle is lengthened.
Figure 10C:
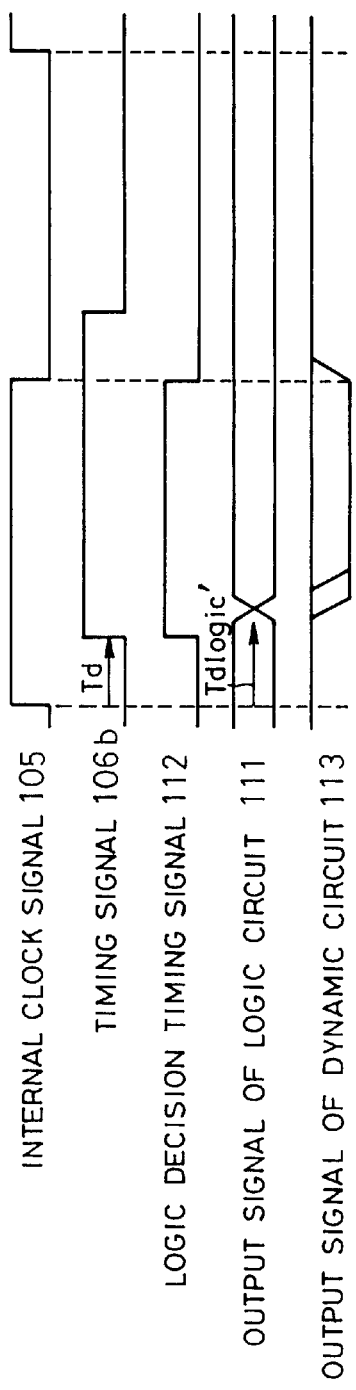

In FIG. 3 is assumed a circuit formed by replacing the delay device 7b of the dynamic circuit shown in FIG. 9 with the delay device 7 shown in FIG. 1.

FIG. 3A shows timing in which a delay in a standard state is assumed at the time of designing the integrated circuit. In this case, the timing signal 106 is formed by delaying the internal clock signal 105 by time Td by the delay device 7. A logic decision period begins with the delay of the time Td from the rise or the first transition of the internal clock signal 105 and finishes at the fall or the last transition of the internal clock signal 105. A logic circuit serves to output a signal with the delay of time Td logic which enters the input of the dynamic circuit. Since the delay time Td is set to a value equal to or longer than the time Td logic, the logic decision period starts after the output of the logic circuit is defined.

FIG. 3B shows a case in which the output of the logic circuit is delayed because of unevenness in manufacturing the integrated circuit to have a delay time of Td logic'. When the clock frequency is returned to an original frequency, the time Td logic' is longer than the time Td, hence, an input signal changes within the logic decision period, and therefore, the dynamic circuit is not operated in a normal manner. Thus, when the cycle or period of the external clock signal is lengthened, such a timing as shown in FIG. 3C can be obtained. The PLL 2 controls the voltage controlled oscillator 5 so as to obtain the frequency equal to the frequency of the internal clock signal. Since the control voltage of the voltage controlled oscillator 5 is inputted to the delay device 7, the time Td is lengthened or increased substantially proportionally to the cycle or the period of the internal clock signal to become time Td'. When the time Td' is equal to or longer than Td logic', the output of the logic circuit is not changed within the logic decision period, so that the dynamic circuit can be operated normally.

Figure 4:
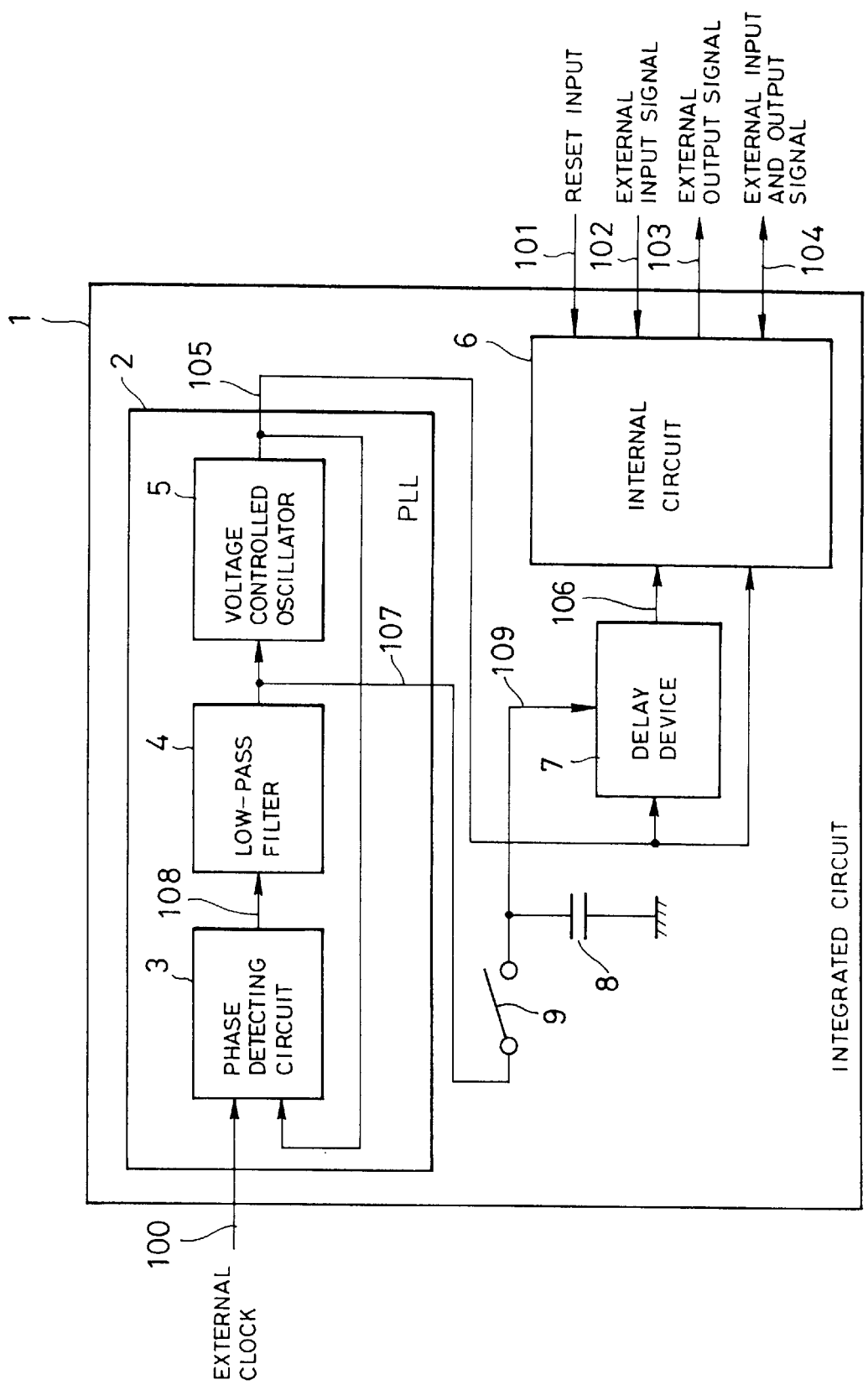
FIG. 4 is a block diagram showing the constitution of an integrated circuit according to a second embodiment of the present invention.

FIG. 4 is a block diagram showing a second embodiment of an integrated circuit according to the present invention. A PLL 2, an internal circuit 6 and a delay device 7 which constitute the integrated circuit are similar to those of the first embodiment of the integrated circuit. A capacitor 8 is provided with the input part of the control signal of the delay device 7. A switch 9 is provided between the capacitor 8 and a control voltage signal 105 supplied from the PLL 2. This switch 9 can be formed with a CMOS transfer gate or the like.

The switch 9 is controlled by a reset signal 101 so that it is turned on during the reset period of the integrated circuit 1. On the other hand, when the integrated circuit 1 operates in an ordinary manner, the switch 9 is turned off. Thus, the capacitor 8 is charged with control voltage during the reset period of the integrated circuit 1. After the reset period of the integrated circuit is cancelled, the delay time of the delay device 7 is controlled so as to be maintained at a prescribed value by a voltage signal 109 as an output with which the capacitor 8 is charged. In other words, the capacitor 8 is charged with the control voltage during the reset period of the integrated circuit 1 in which the integrated circuit 1 hardly receives the influence of noise. After that, the switch 9 is turned off and the delay time of the delay device 7 is controlled so as to be maintained to a prescribed value under the voltage with which the capacitor 8 is charged.

Since the distance from the PLL 2 to the delay device 7 may become relatively long, the integrated circuit 1 may possibly receive the influence of noise generated due to the operations of an internal clock signal 105 or the logic signal of the internal circuit. Since the control signal 107 of the delay device 7 is a signal of voltage, it can be anticipated that the delay time caused by the delay device 7 is brought into an unstable state owing to the change of voltage due to the noise generated. In this instance, however, the switch 9 and the capacitor 8 are arranged in the vicinity of the delay device 7, so that the influence or the effect of the noise can be lowered as much as possible.

Figure 5:
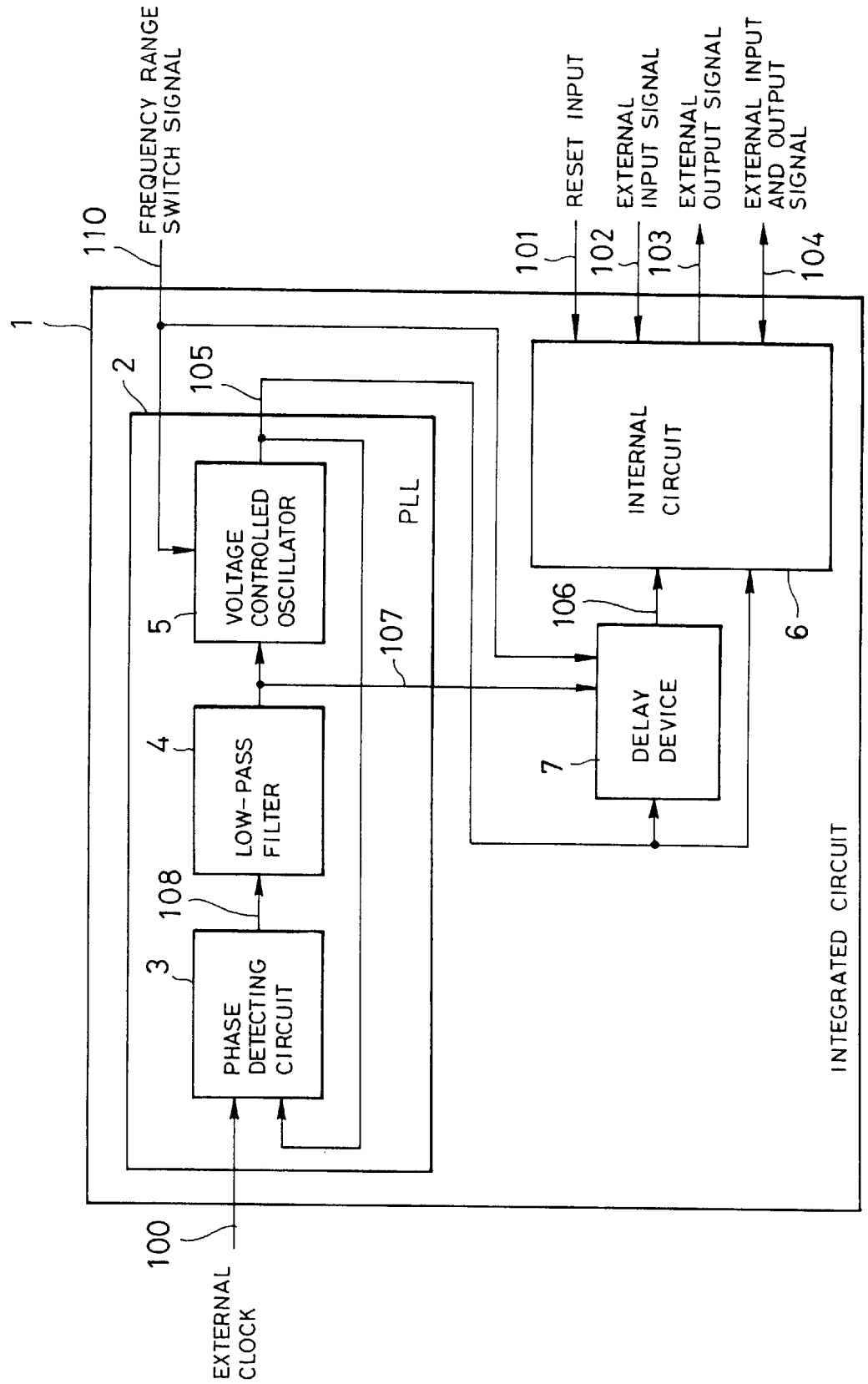
FIG. 5 is a block diagram showing the constitution of an integrated circuit according to a third embodiment of the present invention.

FIG. 5 is a block diagram showing a third embodiment of an integrated circuit according to the present invention. In the integrated circuit of the third embodiment, in order to widen the range of the frequency of a clock signal, the number of stages of the inverters of the voltage controlled oscillator 5 of a PLL 2 may be adjusted by an external switch signal 110. In this case, the same signal, that is to say, the external switch signal 110 also needs to be inputted to a delay device so that the number of the stages of the inverters of the delay device is changed.

Now, an explanation will be given of constructional forms of FIG. 6.

FIG. 6 is constructional examples of the delay device and the voltage controlled oscillator which form the third embodiment of the present invention.

Figure 6A:
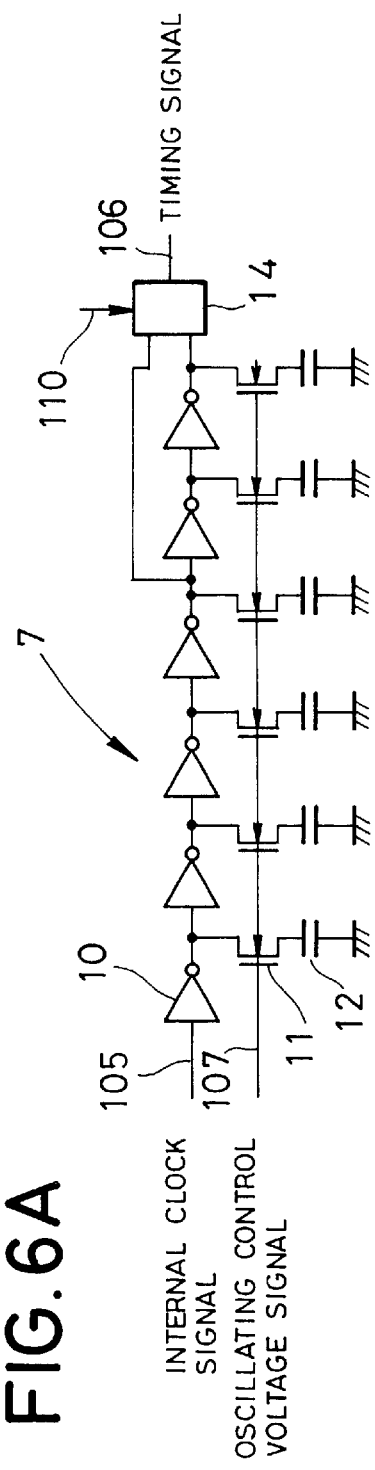
FIG. 6A is a circuit diagram showing the internal structural example of a delay device illustrated in FIG. 5.

FIG. 6A is a diagram showing the circuit constructional example of the delay device 7. As illustrated in FIG. 6A, the delay device 7 is composed of inverters 10 which are connected in series in even number of stages. An NMOS transistor 11 and a capacitor 12 are respectively connected to the output of each of the inverters 10 as a load for adjusting a delay. A voltage control signal 107 is inputted to each of the gates of the NMOS transistors 11 so that the delay amount of the delay device is adjusted. The intermediate signal of an inverter chain is taken out and one signal is outputted by a selector or selecting device 14. The selector 14 is controlled so as to be switched by an external frequency range switch signal 110.

Figure 6B:
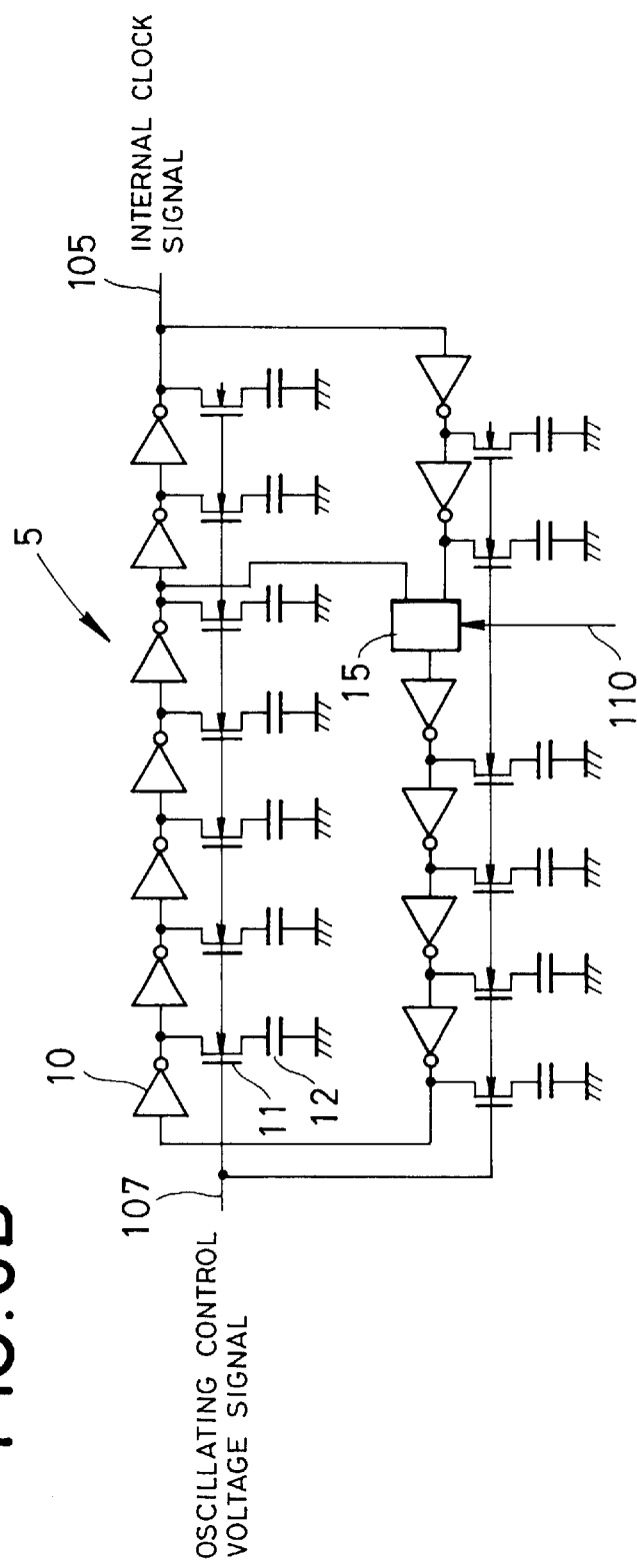
FIG. 6B is a circuit diagram showing the internal structural example of a voltage controlled oscillator illustrated in FIG. 5.

Now, an explanation will be given of the constructional form of the voltage controlled oscillator 5 in FIG. 6B. FIG. 6B is a diagram showing the constructional example of the voltage controlled oscillator 5. As apparent from FIG. 6B, the voltage controlled oscillator 5 is composed of inverters 10, NMOS transistors 11 and capacitors 12 which respectively constitute each of delay variable inverters, similarly to the delay device 7. Then, these delay variable inverters are connected in odd number of stages in the shape of a loop so that an oscillator is formed. Further, a signal outputted on the way of the loop is inputted to a selector or a selecting device 15 so that the number of stages of the inverters which form the loop can be changed. In this manner, the range of oscillating frequency can be varied. In this instance, the selector 15 is switched by the frequency range switch signal 110 which is externally inputted. Parenthetically, the voltage controlled oscillator 5 in the integrated circuit according to the first and second embodiments of the present invention can be formed by deleting the selector 15 from the voltage controlled oscillator 5 shown in FIG. 6B and connecting all the inverters 10 located in a feedback side in series.

In the conventional integrated circuit, the margin is given to the timing signal. Therefore, even when unevenness in manufacturing the integrated circuit is generated, the integrated circuit can be operated in a normal condition. As compared with the conventional integrated circuit, according to the integrated circuit of the present invention, the delay of the delay device for generating the timing signal of the internal circuit is also changed by the frequency of the internal clock signal, the frequency of the internal clock signal is lowered, that is to say, the cycle or period of the internal clock signal is lengthened or increased so that the integrated circuit can be operated in a normal fashion. Accordingly, even when the margin relative to the timing signal upon design of the integrated circuit is deleted, the frequency of the internal clock signal is adjusted so that the integrated circuit can be operated normally. Further, since the margin given to the timing signal in designing the integrated circuit can be deleted, even when the frequency of the internal clock signal is elevated, time (time from which the margin is removed) which can be used for operating the signal can be increased or lengthened.

As described above, according to the integrated circuit of the present invention, the margin is not given to the timing signal and the delay time caused by the internal delay device is externally controlled, so that the delay time of the delay device for generating the timing signal is also changed, and the internal circuit can be operated in a normal manner even if the operating frequency is changed to lower than usual. Consequently, even if the margin relative to the timing signal at the time of designing the integrated circuit is deleted, the integrated circuit can be effectively and desirably operated by adjusting the frequency of the internal clock signal.

What is claimed is:

1. An integrated circuit comprising:

a phase locked loop circuit which feeds back the oscillating output signal of a voltage controlled oscillator and controls the oscillating frequency of the oscillator based on the result of comparison of the phase between the oscillating output signal and an externally supplied clock signal; and a delay device for delaying the oscillating output signal by a prescribed time; said integrated circuit being operated by using the signal thus delayed and said delay device having a delay time whose change is controlled by a control signal corresponding to the phase comparison result.

2. An integrated circuit according to claim 1, wherein said delay device is composed of inverters which are connected in series and time constant circuits which are connected in parallel with the outputs of the inverters, the time constant circuits including series circuits each having an MOS transistor and a capacitor, the change of the on-state resistance of said MOS transistor being controlled by said control signal.

3. An integrated circuit according to claim 2 further including a capacitor charged with said control signal and the change of the on-state resistance of said MOS transistor being controlled by the output discharged from the capacitor.

4. An integrated circuit according to claim 3, wherein said capacitor is charged with control voltage during the reset period of the integrated circuit.

5. An integrated circuit according to claim 1, wherein said voltage controlled oscillator comprises an inverter loop in which a plurality of inverters are connected in the shape of a loop and series circuits each having an MOS transistor and a capacitor which are connected in parallel with the outputs of the respective inverters constituting said inverter loop, the change of the on-state resistance of the MOS transistor being controlled by said control signal.

6. An integrated circuit according to claim 5, wherein said voltage controlled oscillator further includes a means for increasing and/or decreasing the number of stages of the electric connections of the inverters in the inverter loop of said voltage controlled oscillator depending on an externally inputted switch signal.

7. An integrated circuit according to claim 1, wherein the control signal corresponding to said phase comparison result is the output signal of a low-pass filter having said phase comparison result as an input.

8. An integrated circuit according to claim 2, wherein said control signal is applied to the gates of said MOS transistors.

9. An integrated circuit according to claim 2, wherein said delay device comprises the inverters which are connected in series in an even number of stages and time constant circuits which are connected in parallel with the outputs of the inverters, the time constant circuits having series circuits each including an MOS transistor and a capacitor.

10. An integrated circuit according to claim 2, further including a means for increasing and/or decreasing the number of stages of the electric connections of the inverters of said delay device depending on an externally inputted switch signal.

11. An integrated circuit according to claim 1, said integrated circuit having a dynamic circuit, said dynamic circuit comprising:

a precharging means for precharging an output signal with voltage;

a logic decision means for deciding a logic; and a logic decision period determining means for determining said logic decision period based on said oscillating output signal and a signal obtained by delaying the oscillating output signal by a prescribed time.

12. An integrated circuit according to claim 11, wherein said logic decision means outputs an output signal to an input signal within said logic decision period determined by said logic decision period determining means.

13. An integrated circuit according to claim 12, wherein said input signal reaches said logic decision means with the delay of a prescribed time toward said oscillating output signal.

* * * * *